US008624766B2

(12) United States Patent
Pulijala

(10) Patent No.: US 8,624,766 B2
(45) Date of Patent: Jan. 7, 2014

(54) METHOD AND SYSTEM FOR AUTO-RANGING ANALOG-TO-DIGITAL CONVERTER FOR CURRENT SENSING

(75) Inventor: Srinivas K. Pulijala, Tucson, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 27 days.

(21) Appl. No.: 13/307,022

(22) Filed: Nov. 30, 2011

(65) Prior Publication Data
US 2013/0135130 A1 May 30, 2013

(51) Int. Cl.
*H03M 1/00* (2006.01)
(52) U.S. Cl.
USPC ........... 341/139; 341/135; 341/136; 341/142; 341/144; 341/155
(58) Field of Classification Search
USPC ................ 341/134–136, 139, 142, 55, 144
See application file for complete search history.

(56) References Cited

U.S. PATENT DOCUMENTS

| | | | | |
|---|---|---|---|---|
| 5,815,107 A * | 9/1998 | Frankeny et al. | ............. | 341/159 |
| 6,121,913 A * | 9/2000 | Glass et al. | .................. | 341/159 |
| 7,221,191 B2 * | 5/2007 | Ali et al. | ........................ | 327/94 |
| 7,425,909 B2 * | 9/2008 | Rose et al. | .................... | 341/135 |
| 7,446,683 B2 * | 11/2008 | Perner | ........................... | 341/135 |
| 8,078,122 B2 * | 12/2011 | Sahota et al. | .................... | 455/91 |
| 8,274,421 B2 * | 9/2012 | Rey-Losada | .................. | 341/163 |
| 8,325,072 B2 * | 12/2012 | Kuttner | ........................ | 341/136 |
| 2002/0113723 A1 * | 8/2002 | Greig | ........................... | 341/136 |
| 2010/0085225 A1 * | 4/2010 | Chang et al. | .................. | 341/110 |
| 2011/0063154 A1 * | 3/2011 | Hotelling et al. | ............. | 341/143 |
| 2011/0140689 A1 * | 6/2011 | Fernando et al. | ........ | 324/207.25 |
| 2011/0304489 A1 * | 12/2011 | Christer et al. | ............... | 341/118 |
| 2012/0013495 A1 * | 1/2012 | Rey-Losada | .................. | 341/139 |

* cited by examiner

*Primary Examiner* — Linh Nguyen
(74) *Attorney, Agent, or Firm* — King & Spalding L.L.P.

(57) ABSTRACT

Embodiments of the present disclosure provide a method and system for an auto-ranging analog-to-digital converter (ADC) for dynamically scaling inputs to an ADC. The auto-ranging ADC includes a dynamically configurable transistor arrangement for delivering a load current and a replica device for replicating the load current. A current sense resistor generates a replicated load voltage based on the replicated current. The ADC generates a digital value based on the replicated load voltage. The auto-ranging ADC also includes an auto-ranging controller for dynamically configuring the transistor arrangement based on the digital value to scale the inputs to the ADC.

17 Claims, 3 Drawing Sheets

METHOD AND SYSTEM FOR AUTO-RANGING ANALOG-TO-DIGITAL CONVERTER FOR CURRENT SENSING

TECHNICAL FIELD

The present disclosure relates generally to the field of analog integrated circuit design and, more particularly, to methods and systems for power management in electronic circuits.

BACKGROUND

The need to accurately and precisely measure the flow of current in electronic systems is becoming increasingly critical and widespread. The growth of battery-powered portable devices has increased the need to minimize energy usage and manage power requirements of devices, and the spread of electrically actuated systems in various practical applications account for the widespread need.

The latest trends in power management products require performing not only power rationing for downstream devices, but also removal detection events, detecting when a device is physically removed from a circuit. Power rationing requires measuring large amounts of current data of the order of amperes, but removal detection events require measuring low current, usually of the order of few hundred micro amperes. At the end of the charging cycle, for example, a battery under charge may draw extremely low current, but the system needs to know when the device is actually removed from the charger.

A conventional solution for removal detection is to employ a very high resolution analog-to-digital converter (ADC) to measure current over a wide range, from Amperes on the high-end to micro amperes at the lower end of the scale. The high resolution ADCs require output of 16-bits and more. As is well understood in the art, that degree of resolution calls for high die area requirements. Moreover, adding high resolution ADCs to an integrated chip increases the overall power consumption of the chip.

Alternatively, designers use multiple ADCs to perform the desired current sensing and measurement. That solution, however, increases the die area requirements. In addition, multiple ADCs increase the digital signal processing requirements as well as the power consumption.

Thus, there remains a need for an ADC capable of accurately measuring high resolution current values for efficient power management.

SUMMARY

Briefly described, and according to one embodiment, the present disclosure describes a method and system for an auto-ranging analog-to-digital converter (ADC) for dynamically scaling inputs to an ADC. The auto-ranging ADC includes a dynamically configurable transistor arrangement for providing a load current and a replica device for replicating the load current. The replica device outputs a replicated load voltage based on the replicated current. The ADC generates a digital value based on the replicated load voltage. The auto-ranging ADC also includes an auto-ranging controller for dynamically configuring the transistor arrangement based on the digital value to scale the inputs to the ADC.

According to another embodiment, the present disclosure describes an auto-ranging method for dynamically scaling inputs to an analog-to-digital converter (ADC). The auto-ranging method includes providing a load current by a dynamically configurable transistor arrangement and replicating the load current. The method further includes generating a replicated load voltage based on the replicated current. Moreover, the method includes generating a digital value based on the replicated load voltage by the ADC. In addition, the method includes dynamically configuring the transistor arrangement based on the digital value to scale the inputs to the ADC.

Figure 1:
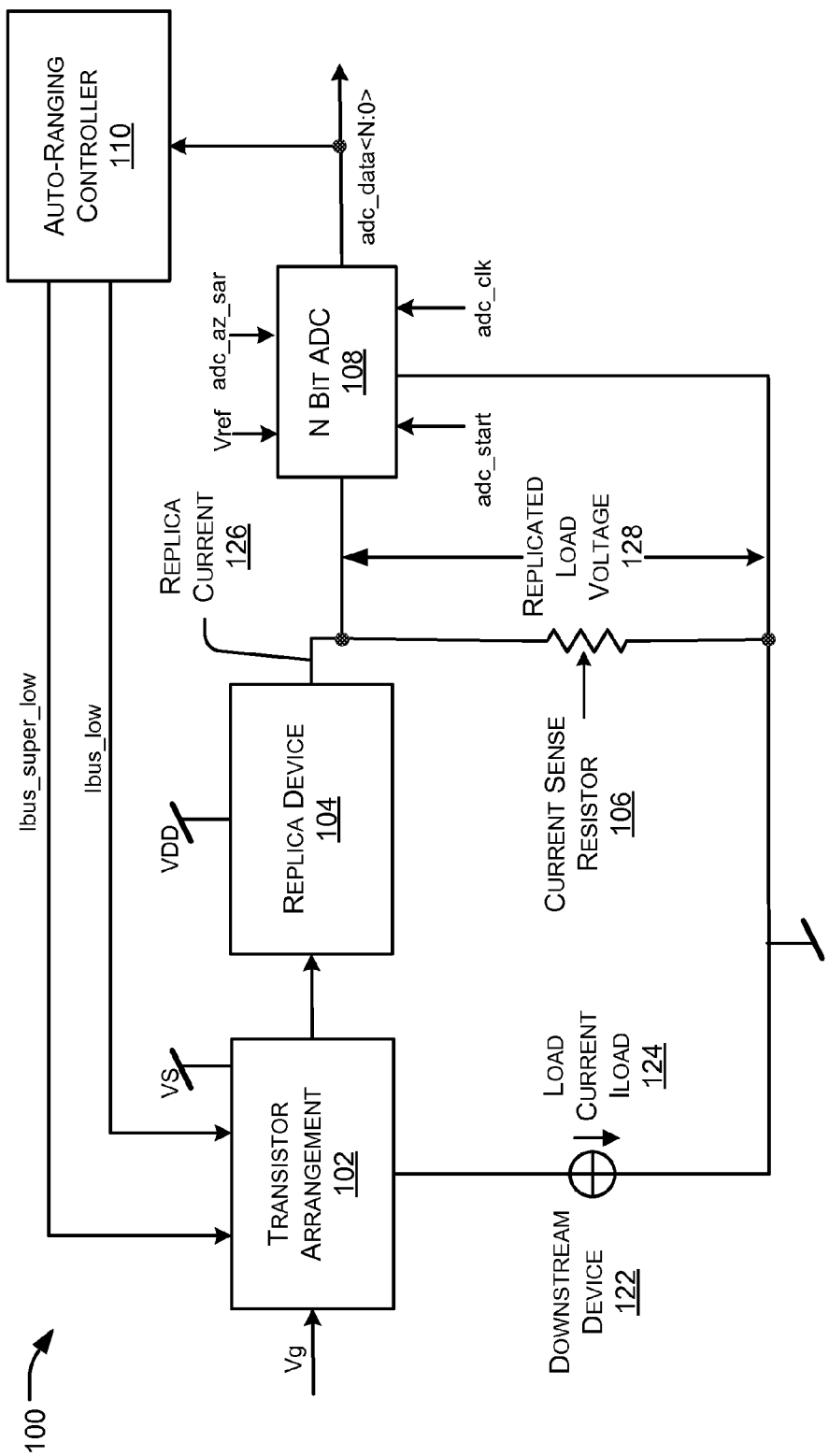
FIG. 1 is a block diagram of one embodiment of an auto-ranging system configured according to principles of the present invention.

While embodiments of the present disclosure are amendable to various modifications and alternative forms, specific embodiments are shown by way of example in the drawings and are described in detail. It should be understood, however, that the drawings and detailed description thereto are not intended to limit the present disclosure to the particular form disclosed, but on the contrary, the intention is to cover all modifications, equivalents, and alternatives falling within the spirit and scope of the present disclosure as defined by the appended claims.

DETAILED DESCRIPTION

The following detailed description is made with reference to the figures. Embodiments are described to illustrate the disclosed system and method, not to limit their scope. With the insight provided by the instant disclosure, those of ordinary skill in the art should recognize a variety of equivalent variations on the description that follows.

Overview

Embodiments of the present disclosure provide a method and system for an auto-ranging analog-to-digital converter (ADC) for dynamically scaling inputs to the ADC. The auto-ranging ADC is used for high-precision measurement of current values. The auto-ranging ADC includes a dynamically configurable transistor arrangement for generating a replica current based on a load current. The load current is generated to meet the varying demands of downstream devices. The dynamically configurable transistor arrangement modifies the prior transistor arrangement to generate a replica current depending on the load current requirement. A replica device is connected to the transistor arrangement in a configuration which generates a replica current based on the load current drawn by a downstream device. The replica current is mirrored to flow through a current sense resistor. Based on the current flowing through the current sense resistor, a voltage is developed across the current sense resistor. The developed voltage is fed to an ADC to generate a digital value corresponding to the developed voltage. The developed voltage may be input to a sample-and-hold, and anti-aliasing filter circuit to avoid the aliasing of higher frequency signals back into the ADC. This voltage may then be fed to the ADC.

The digital value output by the ADC is fed to an auto-ranging controller. Based on the digital value, the auto-ranging controller generates switching signals. When the digital value falls below a threshold value, the auto-ranging controller changes the state of the switching signals. The state of the switching signals determines the configuration of the transistor arrangement. The switching signals dynamically configure the transistor arrangement to scale the inputs to the ADC. The transistor arrangement includes at least two transistors connected in parallel. The dynamic re-configuration involves switching on one or more transistors to provide the required load current to the downstream device. The switching signals connect the switches coupling the input voltage supply to the gate terminals of the transistors. Depending on the state of one or more transistors, load current flows through the transistor arrangement. Therefore, the input to the ADC is scaled accordingly.

The auto-ranging ADC can be used in a wide variety of electronic applications. For example, a USB Port Power Controller can use an embodiment of the disclosure to control a 5V bus voltage, capable of delivering up to 2.5 A load current. The port power switch, including three transistor switches connected in parallel, can be tailored to the anticipated ADC reading. In a normal mode of operation, an eight-bit SAR ADC may perform power-rationing by employing a replica device in parallel with the port power switch to generate a copy current based port power switch current. In order to detect the presence of a down-stream device, which could potentially draw only a few hundred micro-Amps through the port power switch, the port power switch is downsized to generate a replica current within the dynamic range of the ADC. The port power switch is downsized based on the prior reading of the ADC when all the transistors in the port power switch are connected.

Exemplary Systems

FIG. 1 is a block diagram illustrating an exemplary auto-ranging system 100 including an analog-to-digital converter (ADC) 108 for high precision current sensing. The auto-ranging system 100 includes a transistor arrangement 102 electronically coupled to a replica device 104 for replicating a load current (ILoad) 124 flowing through the transistor arrangement 102. A current sense resistor 106 is electronically coupled to the replica device 104 for generating a replicated load voltage 128 based on the replicated current, and that voltage is fed to the ADC 108. That device generates a digital value based on the replicated load voltage 128. An auto-ranging controller 110 receives the ADC output and generates switching signals "Ibus_super_low" and "Ibus_low". Those signals are fed to the transistor arrangement 102, which accordingly configures transistor arrangement 102.

As shown in FIG. 1, a downstream device 122 demands a load current 124 ILoad to meet the power requirement of the downstream device 122 and its components. Inputs to the transistor arrangement 102 are reference supply voltage VS and control voltage Vg. The transistor arrangement 102 can be dynamically configured among two or more current ranges, controlled by inputs "Ibus_super_low" and "Ibus_low".

The replica device 104 also receives control voltage Vg as an input, together with a signal based on the load current 124, and it accordingly outputs a replica current 126. The replica current 126 is fed to current sense resistor 106, which in turn produces a replicated load voltage 128. In an embodiment, the replica device 104 may mirror the replica current 126 before generating the replicated load voltage 128, which is then fed as an input to the ADC 108.

The ADC 108 receives the replicated load voltage 128 and generates a corresponding digital value adc_data <N:0>. Other inputs include "adc_start", an active high signal, which initiates the conversion of the ADC 108. A clock signal "adc_clk" is also provided, as is a voltage reference signal Vref. An auto-zero signal "adc_az_sar", removes any offsets present in the ADC 108. The ADC 108 may also include an anti-aliasing filter for restricting the frequency bandwidth of the replicated load voltage 128.

In an embodiment, the ADC 108 is an 8-bit successive-approximation-register (SAR) analog-to-digital converter (ADC). The ADC 108 outputs a digital value adc_data <N:0>, where N represents the number of bits in the output digital value. For example, an eight bit ADC will generate a digital value adc_data <8:0>.

The auto-ranging controller 110 uses the output digital value adc_data <N:0> to generate switching signals "Ibus_super_low" and "Ibus_low". Those signals are used by the transistor arrangement 102 to dynamically configure the prior transistor arrangement 102. The switching signal output is based on the value of adc_data <N:0>, and thus the auto-ranging controller 110 may include sensing and response circuitry, such as a logic circuit, a microprocessor, a microcontroller, or similar circuits and devices known in the art for generating the switching signals. In an embodiment, the auto-ranging controller 110 may include a memory device, such as a one-time programmable memory (OTP), for storing the threshold values of the digital value for determining the configuration of the transistor arrangement 102. In operation, the transistor arrangement 102 is configured for maximum load current 124. Then, if the ADC 108 reading crosses a threshold value, the auto-ranging controller 110 sends an appropriate signal to the transistor arrangement 102 via switching signals "Ibus_super_low" and "Ibus_low".

Figure 2:
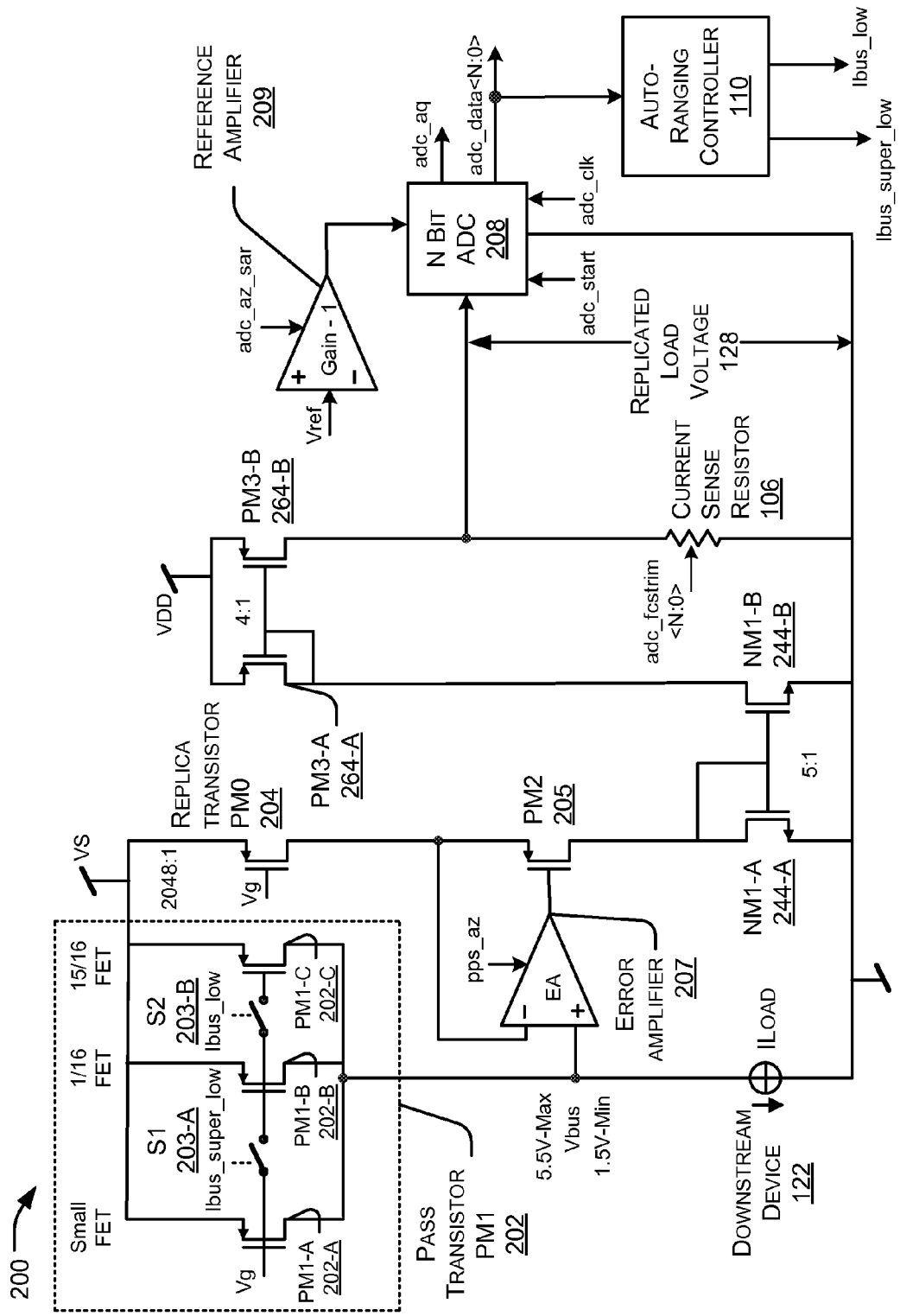
FIG. 2 is a circuit diagram of one embodiment of an auto-ranging system configured according to principles of the present invention

FIG. 2 is a circuit diagram illustrating an exemplary auto-ranging system 200 including an analog-to-digital converter (ADC) 208 for high precision current sensing. The auto-ranging system 200 includes a pass transistor PM1 202, which in turn includes three transistors PM1-A 202-A, PM1-B 202-B, and PM1-C 202-C connected in parallel. A control voltage Vg is connected to the gates of the three transistors PM1-A 202-A, PM1-B 202-B, and PM1-C 202-C, coupled through switches S1 203-A and S2 203-B. The switches S1 203-A and S2 203-B are controlled by switching signals "Ibus_super_low" and "Ibus_low" respectively. All three switches are closed at start-up. The polarities of the switching signals "Ibus_low" and "Ibus_super_low" are determined by the previous ADC 208 reading, which in turn is determined by the load current ILoad drawn by the downstream device 122.

In the pass transistor PM1 202, an extremely low current is accommodated by turning PM1-B 202-B, and PM1-C 202-C off, so that current flows only through PM1-A 202-A. In the illustrated circuit, that branch is designed to receive only a negligible amount of the total available capacity of the pass transistor PM1 202. A medium current level can be provided for by also turning on transistor PM1-B 202-B, which in the illustrated device accommodates $\frac{1}{16}$ of the possible FET current. Full capacity is achieved by also turning on PM1-C 202-C. Details of how those results are accomplished are set out below, together with a truth table for the device and the associated input signals.

A replica transistor PM0 204 generates a replica current based on the load current ILoad using an error amplifier 207. The error amplifier 207 forces the drain voltage of replica transistor PM0 204 to be the same voltage as voltage Vbus through a negative feedback. The error amplifier 207 drives the gate of a transistor PM2 205 to maintain the transistor PM2 205 in saturation while transistors PM1 202 and PM0 204 are controlled by gate voltage Vg. The gate voltage Vg can be used for current limiting purposes. This arrangement results in accurate replication of the load current ILoad. The replicated current is mirrored by the current mirrors NM1-A 244-A and NM1-B 244-B, and PM3-A 264-A and PM3-B 264-B to flow through the current sense resistor 206, developing the replicated load voltage 128.

ADC 208 receives analog replicated load voltage 128 and performs analog to digital conversion. In an embodiment, ADC 208 includes both sample-and-hold and anti-aliasing filter circuits. The anti-aliasing feature prevents aliasing higher frequency signals back into the baseband of the ADC 208. Reference amplifier 209 provides a 2.5V reference voltage, generated based on a band gap voltage. As the maximum current drawn across the pass transistor PM1 202 cannot exceed 2.5 A, the full-scale voltage of the ADC 208 is set to 2.5V. The mathematical calculation for calculating the resolution of an 8-bit ADC is shown below. A LSB, thus, equals $$1\ LSB = (2.5\ Amperes/2^8) = 9.76\ mA \qquad (1)$$

For an eight-bit ADC, 1 LSB equaling 9.76 mA corresponds to 9.76 mV. This mode is used for power rationing.

The ADC 208 receives the replicated load voltage 128 signal and generates a corresponding digital value adc_data <N:0>. Other inputs include "adc_start", an active high signal, which initiates the functioning of the ADC 108. A clock signal "adc_clk" is also provided, as is a voltage reference signal Vref. An auto-zero signal "adc_az_sar", removes any offsets present in the ADC 108. The ADC 108 may also include an anti-aliasing filter for restricting the frequency bandwidth of the replicated load voltage 128.

In an embodiment, the ADC 208 is an 8-bit successive-approximation-register (SAR) analog-to-digital converter (ADC). The ADC 208 outputs a digital value adc_data <N:0>, where N represents the number of bits in the output digital value. For example, an eight bit ADC will generate a digital value adc_data <8:0>.

The auto-ranging controller 110 uses the output digital value adc_data <N:0> to generate switching signals "Ibus_super_low" and "Ibus_low". Those signals are used by the transistor arrangement 102 to dynamically configure the transistor arrangement 102. The switching signal output is based on the value of adc_data <N:0>, and thus the auto-ranging controller 110 may include sensing and response circuitry, such as a logic circuit, a microprocessor, a microcontroller, or similar circuits and devices known in the art for generating the switching signals In an embodiment, the auto-ranging controller 110 may include a memory device, such as a one-time programmable memory (OTP), for storing the threshold values of the digital value for determining the configuration of the transistor arrangement 102. In normal operation, the transistor arrangement 102 is configured for maximum load current. Then, if the ADC 108 reading crosses a threshold value, the auto-ranging controller 110 sends an appropriate signal to the transistor arrangement 102 via switching signals "Ibus_super_low" and "Ibus_low".

In an embodiment, the auto-ranging system 200 may also operate in a charger emulation mode. The charger emulation mode demands greater accuracy in terms of the ADC resolution for load currents ILoad below 150 mA. For example a USB Port Power Controller using the auto-ranging system 200 may operate in the charger emulation mode for accurately determining the load current flow in microamperes. In the charger emulation mode when the ADC reading falls below 16 LSB's for four consecutive conversions, which is equivalent to 156.25 mA, the transistor PM1-C (15/16 FET) is turned off. Therefore, the auto-ranging controller 110 drives the switching signal "Ibus_super_low" low, and "Ibus_low" high. As a result, the switch S2 203-B is in an open state, i.e., an off state. Thus, the control voltage Vg is cut off from the transistor PM1-C 202-C. As a result, the transistor PM1-C gets turned off. A hysteresis of 10 LSB's was added to prevent switching between the FET's around the threshold of 156.25 mA. Thus, the LSB in the charger emulation mode for an 8-bit ADC is $$1\ LSB = (156.25\ milli\ Amperes/2^8) = 610\ micro\ Amperes \qquad (2)$$

In another embodiment, the auto-ranging system 200 may also operate in a third mode, removal detection. The removal detection mode demands even greater accuracy in terms of the ADC resolution for load current ILoad below 200 microamperes. For example, a USB Port Power Controller using the auto-ranging system 200 may operate in the removal detection mode for accurately determining events when the downstream device 122 is removed and the load current falls below 200 micro amperes. The USB Port Power controller has a removal detection mechanism to detect the removal event. When the auto-ranging system 200 is in charger emulation mode (i.e., the transistors PM1-A 202-A and PM1-B 202-B are turned ON), and the ADC 208 reading drops below 16 LSB's (each LSB being 610 micro amperes), only the transistor PM1-A 202-A in the pass transistor PM1 202 is turned ON. If the ADC reading falls below a threshold reading, a removal event is detected. The threshold for removal detection can be set by one-time programmable memory (OTP) included in the auto-ranging controller 110. A hysteresis of 6 LSB's was used to switch between the state when only the transistor PM1-A 202-A is turned ON and the state when all the three transistors are turned ON. As the current sense ADC conversion rate is only 2 KHz, a 200 mV drop comparator across Vbus was used to turn ON the Full transistor PM1 202, if the drop across Vbus exceeds 200 mV. The current sense resistor 206 can be trimmed for process variations using OTP. The truth table below shows the combination for which the different transistors PM1-A 202-A, PM1-B 202-B, and PM1-C 202-C in the pass transistor PM1 202 are turned ON for different values of switching signals "Ibus_low" and "Ibus_super_low".

TABLE I

| Pass Transistor transition | | |
|---|---|---|
| Ibus_low | Ibus_super_low | Pass transistor PM1 |
| 0 | 0 | Full FET |
| 1 | 0 | 1/16 FET |
| 1 | 1 | Small FET |

Thus, pass transistor PM1 operates in one of three ranges depending on how many of its component transistors is turned on. The range labeled Full FET is enabled when all the three transistors PM1-A 202-A, PM1-B 202-B, and PM1-C 202-C are turned ON, allowing current flow in all three branches of the pass transistor PM1 202. Range 1/16 FET, which passes $1/16^{th}$ of the maximum current, is operative when the transistors PM1-A 202-A, and PM1-B 202-B are turned ON. The lowest range, allowing only small amounts of current, range Small FET is operative when only the transistor PM1-A 202-A is turned ON. This system yields a high precision measurement of load current by not only accurately detecting amperes of current in the high end but also detecting few microamperes of current at the low end.

It will be understood that though embodiments of the present disclosure may be described using PMOS or NMOS transistors, the embodiments of this disclosure are not restricted to MOS transistors. The embodiments may, just as easily, be incorporated in an auto-ranging scheme, without departing from the scope of the present disclosure.

Exemplary Methods

Figure 3:
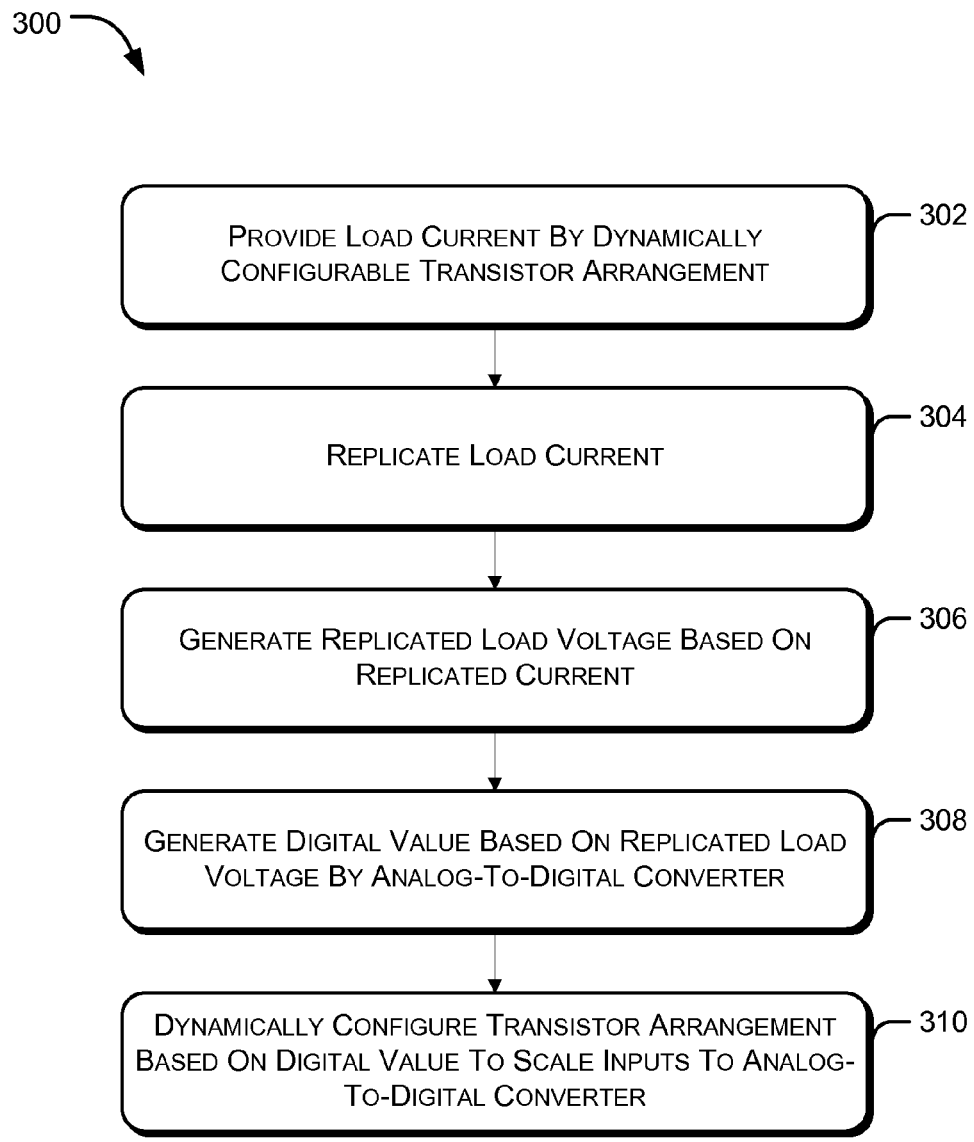
FIG. 3 is a flowchart depicting an exemplary method for auto-ranging an ADC.

FIG. 3 is a flowchart depicting an exemplary method for auto-ranging an analog-to-digital converter for high precision current sensing. The method 300 illustrated in FIG. 3 may be used in conjunction with any of the systems or devices shown in the previously described figures, among other devices. In various embodiments, some of the method elements shown may be performed concurrently, in a different order than shown, or may be omitted. Additional method elements may be performed as desired. As shown, the method 300 may operate as follows.

At step 302, the transistor arrangement 102 provides load current 124 ILoad to meet the power requirements of the downstream device 122. The transistor arrangement 102, connected to the downstream device 122, is coupled between the supply voltage VS and the voltage Vbus. A control voltage signal Vg is provided to the transistor arrangement 102 to provide the required amount of the load current 124 ILoad. Switching signals "Ibus_super_low" and "Ibus_low" are fed to the transistor arrangement 102 to determine the configuration of the transistor arrangement 102.

At step 304, the replica device 104 replicates the load current 124 ILoad. The replica device 104 is connected to the transistor arrangement 102 to generate a replica current 126 based on the load current 124. An auto-zeroed error amplifier 207 forces the VDS on replica transistor PM0 204 to be the same as the pass transistor PM1 202. This causes accurate replication of the load current 214 ILoad to the replica current 126. The replica current 126 is transferred to the current sense resistor 106. In an embodiment, the replica current 126 is mirrored to flow through the current sense resistor 106. A current mirror may be used to mirror the replicated current to the current sense resistor 106.

At step 306, the current sense resistor 106 generates the replicated load voltage 128 based on the replicated current flowing through the current sense resistor 106. The replicated load voltage 128 is fed to the ADC 108 as an input. The current sense resistor 106 monitors the replica current 126 and translates the amount of current into the replicated load voltage 128 that can be easily measured and monitored.

At step 308, the ADC 108 generates a digital value based on the replicated load voltage 128. The replicated load voltage 128 is fed to the ADC 108 for analog to digital conversion of the voltage signal. The ADC 108 receives the replicated load voltage 128 signal and generates a digital value adc_data <N:0> corresponding to the replicated load voltage 128. A signal "adc_start" initiates the functioning of the ADC 108. The signal "adc_start" is an active high signal. Therefore, a high state of the signal "adc_start" signals the ADC 108 to start functioning. A clock signal "adc_clk" is supplied to the ADC 108 to clock the functioning of the ADC 108. The ADC 108 also receives an auto-zero signal "adc_az_sar" to remove the offsets present in the ADC 108. A voltage reference signal Vref is also provided to the ADC 108 to meet the voltage requirements. In an embodiment, the replicated load voltage 128 is input to a sample-and-hold, and anti-aliasing filter circuit for filtering the replicated load voltage 128 signal to restrict frequency bandwidth of the replicated load voltage 128 signal. The sample-and-hold, and anti-aliasing filter circuit prevents the aliasing of higher frequency signals back into the baseband of the ADC 208. This voltage is then fed to the ADC 108.

At step 310, the transistor arrangement 102 is dynamically configured based on the digital value. The auto-ranging controller 110 uses the output digital value adc_data <N:0> to generate switching signals "Ibus_super_low" and "Ibus_low". The switching signals "Ibus_super_low" and "Ibus_low" are used to dynamically change the configuration of the transistor arrangement 102. If the ADC 108 reading crosses a threshold value, the auto-ranging controller 110 sends an appropriate signal to the transistor arrangement 102 via signals "Ibus_super_low" and "Ibus_low". In an embodiment, the auto-ranging controller 110 may include a memory device for storing the threshold values of the digital value for determining the configuration of the transistor arrangement 102. The memory device may include a one-time programmable memory (OTP). In another embodiment, the auto-ranging method 300 may also include switching the state of at least one of the transistors PM1-A 202-A, PM1-B 202-B, and PM1-C 202-C to dynamically change the configuration of the transistor arrangement 102. One or more of the three transistors PM1-A 202-A, PM1-B 202-B, and PM1-C 202-C may be switched ON to provide the desired amount of current.

In another embodiment, the auto-ranging method 300 may also include determining a state of switching signals "Ibus_super_low" and "Ibus_low" from a switching table for a configuration of the transistor arrangement 102. The auto-ranging controller 110, including a memory device may store a switching table. The switching table tabulates the state of switching signals for various configurations of the transistor arrangement 102.

The methods and systems discussed in the present disclosure provide techniques for auto-ranging an ADC for high precision current measurement. The disclosed techniques present a high precision auto-ranging scheme with low quiescent current demands. The circuit implementations of the auto-ranging systems will consume lesser die area. The auto-ranging technique allows the use of low resolution ADCs to achieve high resolution for very small load currents.

Those in the art will understand that the steps set out in the discussion above may be combined or altered in specific adaptations of the disclosure. The illustrated steps are set out to explain the embodiment shown, and it should be anticipated that ongoing technological development will change the manner in which particular functions are performed. These depictions do not limit the scope of the present disclosure, which is determined solely by reference to the appended claims.

What is claimed is:

1. An auto-ranging system for dynamically scaling inputs to an analog-to-digital converter, the auto-ranging system comprising:
   a dynamically configurable transistor arrangement for providing a load current;
   a replica device for replicating the load current and generating a replicated load voltage based on the replicated current;
   an analog-to-digital converter for generating a digital value based on the replicated load voltage; and
   an auto-ranging controller for dynamically configuring the transistor arrangement based on the digital value to scale the inputs to the analog-to-digital converter.

2. The auto-ranging system of claim 1, further comprising an anti-aliasing filter for restricting frequency bandwidth of the replicated load voltage.

3. The auto-ranging system of claim 1, further comprising a current mirror for mirroring the replicated load current.

4. The auto-ranging system of claim 1, further comprising a current sense resistor for generating the replicated load voltage based on the replicated current.

5. The auto-ranging system of claim 1, wherein the transistor arrangement includes at least three transistors connected in parallel to each other.

6. The auto-ranging system of claim 5, wherein a state of a transistor is switched to dynamically configure of the transistor arrangement.

7. The auto-ranging system of claim 1, wherein the auto-ranging controller includes a memory device for storing a threshold value of the digital value for determining the configuration of the transistor arrangement.

8. The auto-ranging system of claim 7, wherein the memory device is a one-time programmable memory.

9. The auto-ranging system of claim 7, wherein the memory device stores a switching table for determining a state of switches which change the configuration of transistor arrangement.

10. The auto-ranging system of claim 1, wherein the analog-to-digital converter is an 8-bit successive-approximation-register (SAR) analog-to-digital converter (ADC).

11. An auto-ranging method for dynamically scaling inputs to an analog-to-digital converter, the auto-ranging method comprising:
   providing a load current by a dynamically configurable transistor arrangement;
   replicating the load current;
   generating a replicated load voltage based on the replicated current;
   generating a digital value based on the replicated load voltage by the analog-to-digital converter; and
   dynamically configuring the transistor arrangement based on the digital value to scale the inputs to the analog-to-digital converter.

12. The auto-ranging method of claim 11, further comprising filtering the replicated load voltage to restrict frequency bandwidth of the replicated load voltage.

13. The auto-ranging method of claim 11, further comprising mirroring the replicated load current by a current mirror.

14. The auto-ranging method of claim 11, wherein the transistor arrangement includes at least three transistors connected in parallel to each other.

15. The auto-ranging method of claim 14, further comprising switching a state of a transistor to dynamically configure of the transistor arrangement.

16. The auto-ranging method of claim 11, further comprising determining the configuration of the transistor arrangement based on a threshold value of the digital value.

17. The auto-ranging method of claim 11, further comprising determining a state of switching signals from a switching table for a configuration of the transistor arrangement.

* * * * *